United States Patent
Li et al.

(10) Patent No.: US 9,712,178 B2
(45) Date of Patent: Jul. 18, 2017

(54) DYNAMIC RESOLUTION ADJUSTMENT FOR DIGITAL CONVERTERS

(71) Applicant: TEXAS INSTRUMENTS INCORPORATED, Dallas, TX (US)

(72) Inventors: Hao Li, Shanghai (CN); Thomas R. Neu, Parker, TX (US); Xiaopeng Li, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 505 days.

(21) Appl. No.: 14/268,278

(22) Filed: May 2, 2014

(65) Prior Publication Data

US 2014/0328353 A1 Nov. 6, 2014

Related U.S. Application Data

(60) Provisional application No. 61/818,967, filed on May 3, 2013, provisional application No. 61/829,853, filed on May 31, 2013.

(51) Int. Cl.
*H03M 1/00* (2006.01)
(52) U.S. Cl.
CPC .................. *H03M 1/007* (2013.01)
(58) Field of Classification Search
None
See application file for complete search history.

(56) References Cited

U.S. PATENT DOCUMENTS

| | | | | |
|---|---|---|---|---|
| 4,823,130 A * | 4/1989 | Wright | ............... | H03M 1/007 341/155 |
| 5,877,720 A * | 3/1999 | Setty | ............... | H03M 1/007 341/120 |
| 6,650,265 B1 * | 11/2003 | Bugeja | ............... | H03M 1/002 341/131 |
| 7,642,943 B1 * | 1/2010 | Cetin | ............... | H03M 1/007 323/272 |
| 7,656,970 B1 * | 2/2010 | Sankabathula | ....... | H04L 43/024 375/316 |
| 2002/0093441 A1 * | 7/2002 | Wiesbauer | ............ | H03M 3/416 341/143 |
| 2003/0076250 A1 * | 4/2003 | Enochson | ............ | H03M 1/004 341/120 |
| 2004/0125008 A1 * | 7/2004 | Yamaji | ............... | H03M 1/007 341/155 |
| 2005/0122247 A1 * | 6/2005 | Hammerschmidt | .. | H03M 1/002 341/163 |

(Continued)

*Primary Examiner* — Hassan Phillips
*Assistant Examiner* — Gautam Sharma
(74) *Attorney, Agent, or Firm* — Goutham Kondapalli; Charles A. Brill; Frank D. Cimino

(57) ABSTRACT

A circuit includes a digital converter configured to convert an input signal to an output signal. The digital converter is configured to provide the output signal with at least one of a plurality of different output resolutions during each frame based on a control input. A resolution controller is configured to provide the control input to set the resolution of the digital converter to include at least two of the plurality of different output resolutions during each respective frame, such that an aggregate resolution for the digital converter is maintained below a predetermined threshold over time. The aggregate resolution is based on a ratio of the different output resolutions during each respective frame.

20 Claims, 5 Drawing Sheets

(56) References Cited

U.S. PATENT DOCUMENTS

| | | | |
|---|---|---|---|
| 2005/0270217 A1* | 12/2005 | Chiang | H03M 1/007 341/161 |
| 2006/0187105 A1* | 8/2006 | Sakata | H03M 1/002 341/155 |
| 2007/0024481 A1* | 2/2007 | Rivoir | H03M 1/005 341/144 |
| 2007/0030192 A1* | 2/2007 | Son | G09G 3/20 341/156 |
| 2008/0129567 A1* | 6/2008 | Lee | H03M 1/002 341/155 |
| 2008/0266158 A1* | 10/2008 | Kawamoto | H03M 1/007 341/155 |
| 2009/0153384 A1* | 6/2009 | Rofougaran | H03M 1/186 341/155 |
| 2009/0174586 A1* | 7/2009 | Muenter | H03M 1/007 341/131 |
| 2011/0090240 A1* | 4/2011 | Cohen | G06T 5/20 345/589 |
| 2012/0229319 A1* | 9/2012 | Takahashi | H03M 1/007 341/155 |
| 2013/0027595 A1* | 1/2013 | Hashizume | H03M 1/007 348/302 |
| 2013/0262129 A1* | 10/2013 | Choi | G10K 11/002 704/500 |

\* cited by examiner

DYNAMIC RESOLUTION ADJUSTMENT FOR DIGITAL CONVERTERS

CROSS-REFERENCE TO RELATED APPLICATION

This application claims the benefit of U.S. Provisional Patent Application 61/818,967 filed on May 3, 2013, and entitled A NEW TYPE OF WORKING MODE OF HIGH SPEED ADC FOR TDD RECEIVER APPLICATION. This application also claims the benefit of U.S. Provisional Patent Application 61/829,853 filed on May 31, 2013, and entitled A NEW TYPE OF WORKING MODE OF HIGH SPEED ADC FOR TDD RECEIVER APPLICATION. The entirety of each of the above-identified applications is incorporated by reference herein.

TECHNICAL FIELD

This disclosure relates to digital converters, and more particularly to a digital converter circuit that can dynamically adjust its output resolution over the course of a frame.

BACKGROUND

Many countries have laws which control the export of certain products and technologies for strategic reasons. Without an appreciation of export control law for a given country, a business risks inadvertent violations with significant consequences as problems can occur in unlikely circumstances where violators are subject to criminal and/or administrative penalties. Many governments take the position that industry compliance is the first and best line of defense in protecting national security interests. Thus, compliance with export control law allows industry to avoid enforcement actions by preventing violations.

One class of technology that can be subject to export control laws includes digital converters such as analog to digital converters (ADC) and digital to analog converters (DAC). Export controls typically specify a maximum resolution output at a given sample rate for the converter. For example, ADC resolution is typically limited by export control law in the United States, for example, to 14 bits of resolution at 125 mega-samples per second (MSPS). Unfortunately, such limitations on resolution can severely limit the ability to support other applications such as the ability to convert data at a communications base station, for example.

SUMMARY

This disclosure relates to a digital converter circuit that dynamically adjusts its output resolution over the course of a given frame.

In one aspect, a circuit includes a digital converter configured to convert an input signal to an output signal. The digital converter is configured to provide the output signal with at least one of a plurality of different output resolutions during each frame based on a control input. A resolution controller is configured to respond the control input to set the resolution of the digital converter to include at least two of the plurality of different output resolutions during each respective frame, such that an aggregate resolution for the digital converter is maintained below a predetermined threshold over time. The aggregate resolution is based on a ratio of the different output resolutions during each respective frame.

In another aspect, a circuit includes a digital converter configured to convert an input signal to an output signal. The digital converter is configured to provide the output signal with at least one of a plurality of different output resolutions during each frame based on a control input. A resolution controller is configured to respond to the control input to set the resolution of the digital converter to include at least two of the plurality of different output resolutions during each respective frame, such that an aggregate resolution for the digital converter is maintained below a predetermined threshold over time. The aggregate resolution can be based on a duty cycle of the at least two of the plurality of different output resolutions during each respective frame. A duty cycle calculator compares the duty cycle to a predetermined duty cycle threshold. The duty cycle calculator commands the resolution to a lower duty cycle if the predetermined duty cycle threshold is exceeded.

In yet another aspect, a digital converter is configured to convert an input signal to an output signal, wherein the digital converter is configured to provide the output signal with at least one of a plurality of different output resolutions during each frame based on a control input. A duty cycle adjuster is configured to respond to the control input to set the resolution of the digital converter to include at least two of the plurality of different output resolutions during each respective frame, such that an aggregate resolution for the digital converter is maintained below a predetermined threshold over time. The aggregate resolution can be based on a duty cycle of the at least two of the plurality of different output resolutions during each respective frame. The duty cycle adjuster includes at least one high resolution counter and at least one low resolution counter to specify the duty cycle of the at least two of the plurality of different output resolutions during each respective frame. A duty cycle calculator compares the duty cycle to a predetermined duty cycle threshold. The duty cycle calculator commands the resolution to a lower duty cycle if the predetermined duty cycle threshold is exceeded.

DETAILED DESCRIPTION

This disclosure relates to a digital converter circuit that dynamically adjusts its output resolution over the course of a given frame. A digital converter can be configured to convert an input signal to an output signal and includes analog to digital converters (ADC) or digital to analog converters (DAC), for example. The digital converter can be dynamically configured to provide the output signal with various resolutions (e.g., 9 bit, 12 bit, 14 bit output) based on a control input to the converter. This can include providing the output signal with at least one of a plurality of different output resolutions during each frame based on a control input. A resolution controller responds to the control input to set the resolution of the digital converter to include at least two of the different output resolutions during each respective frame, such that an aggregate resolution for the digital converter is maintained below a predetermined threshold over time. The term aggregate resolution refers to maintaining resolution during the course of a given frame such that the overall resolution over the course of the frame does not exceed a given resolution threshold that can be set by export regulations, for example.

For example, in an ADC application, the ADC output signal during short periods of a frame can be provided at high resolution (e.g., 14 bits) and other inactive periods of the frame the ADC output signal can be provided at lower resolution. The aggregate resolution for the frame can be based on a ratio of the plurality of different output resolutions during each respective frame. By outputting higher resolutions during short periods of the frame (e.g., frame subsets or sub-frames) and lower resolutions during other periods of the frame, complex applications such as cell phone base stations can be supported at higher resolution during the short periods while maintaining compliance with export limits by mixing lower resolution periods over the course of the frame.

Figure 1:
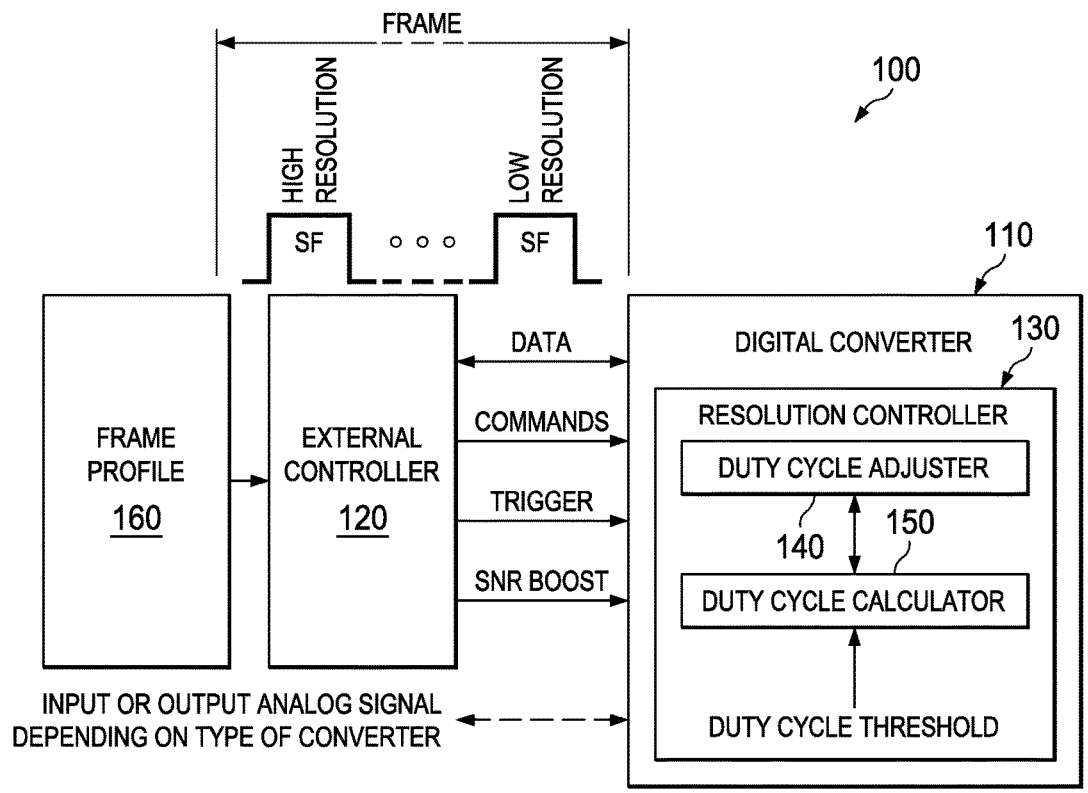
FIG. 1 illustrates an example of schematic block diagram of a digital converter circuit that dynamically adjusts its output resolution over the course of a given frame.

FIG. 1 illustrates an example of a digital converter circuit 100 that dynamically adjusts its output resolution over the course of a given frame. As used herein, the term circuit can include a collection of active and/or passive elements that perform a circuit function such as a controller, an analog to digital converter (ADC), or digital to analog converter (DAC), for example. The term circuit can also include an integrated circuit where all the circuit elements are fabricated on a common substrate, for example. A digital converter 110 can be configured to convert an input signal to an output signal and includes analog to digital converters (ADC) or digital to analog converters (DAC), for example. In an ADC example, the input signal would be an analog input (e.g., received on a cell uplink channel) and the output signal would be DATA sent to an external controller 120 (e.g., field programmable gate array) representing digitized data of the analog input. In a DAC example, the input signal would be the DATA received from the external controller 120 and the output signal would be an analog output from the digital converter 110 (e.g., analog downlink channel).

The digital converter 110 can be dynamically configured to provide the output signal with various resolutions (e.g., 9 bit, 12 bit, 14 bit output) based on a control input (TRIGGER) to the converter. This can include providing the output signal with at least one of a plurality of different output resolutions during each frame based on the control input. As used herein, the term frame includes a set of data that can be delivered over a given period of time (e.g., 10 milliseconds, 1 second, 1 hour, and so forth). An example FRAME is shown having 1 high resolution sub-frame (SF) and 1 low resolution SF. A typical frame can include several sub-frames (e.g., 10 sub-frames). A resolution controller 130 can be configured to respond to the control input TRIGGER to set the resolution of the digital converter 110 to include at least two of the different output resolutions during each respective frame such that an aggregate resolution for the digital converter is maintained below a predetermined threshold over time.

As used herein, the term aggregate resolution refers to maintaining resolution during the course of a given frame such that the overall resolution over the course of the frame does not exceed a given threshold that can be set by export regulations, for example. Thus, if a maximum resolution were specified at a number of mega samples per second (MSPS) (e.g., 14 bit maximum resolution for 125 mega-samples per second), then if the converter were to be operated at some higher sample rate (e.g., 500 MSPS), lower resolution would have to be provided to still be in regulatory compliance. By dynamically adjusting resolution during the course of a frame however, short periods of high resolution can be provided between other low resolution periods within the frame to support high resolution applications while still meeting the aggregate resolution limits set for the course of the frame.

In one example, in an ADC application, the ADC output signal (shown as DATA) during short periods of a frame can be provided at high resolution (e.g., 14 bits) and other inactive periods of the frame the ADC output signal can be provided at lower resolution (e.g., 9 bits). In some cases such as a TDD application where the output of the ADC is not used during downlink periods of a frame, the ADC output can be reduced to a lower number of bits, such as down to zero bits during the downlink portion to facilitate power saving in the circuit. The aggregate resolution for the frame can be based on a ratio of the plurality of different output resolutions during each respective frame. By outputting higher resolutions during short periods of the frame (e.g., frame subsets or sub-frames) and lower resolutions during other periods of the frame, complex applications such as cell phone base stations can be supported at higher resolution during the short periods of providing high resolution while maintaining overall compliance with export limits over the course of the frame.

In a specific application example, a time division duplex (TDD) system can be supported via dynamic resolution adjustment as disclosed herein. For example, in a TDD base station, the receive phase (uplink) and transmit phase (downlink) are alternative. Thus, only during a receive (RX) phase, would a base station ADC need to output its respective sampling data, and consequently does not need to output data during the transmit (TX) phase. During the receive phase, the ADC output can thus be configured as high resolution output in order to meet the high dynamic range requirements of the base station. During the transmit phase, the output of the ADC can be configured to low resolution output. In this manner, the overall throughput of high resolution output data is reduced to conform with existing regulations while meeting the challenging performance requirements for a telecom receiver.

In another application example, fractional-N mode programming can be supported in the digital converter 110 for definition of high/low resolution output mode. In this manner, the number of high and low resolution samples can be configured such that they line up with the actual TDD sub-frame length. In addition, multiple consecutive sets of high and low resolution frames can be configured such that order of receive and transmit time slots in the TDD sub-frame can be selected arbitrarily. Such programming will be illustrated and described below with respect to FIGS. 2-6.

As shown, the resolution controller 130 can include a duty cycle adjuster 140 that adjusts the operation of the high and low resolution output over the course of the frame. As used herein, the term duty cycle refers to the number of high resolution outputs to the number of low resolution outputs that are generated over the course of one frame by the digital converter 110. In one example, the duty cycle adjuster 140 can be a register bank that is programmed via commands (shown as COMMANDS) received from the external controller 120. In another example, the duty cycle adjuster 140 could be control logic that adjusts the duty cycle via an instruction sequence in the control logic.

A duty cycle calculator 150 is employed to verify the programming of the duty cycle adjuster 140. If the programming of the duty cycle adjuster 140 exceeds a predetermined duty cycle threshold (shown as DUTY CYCLE THRESHOLD), the duty cycle calculator 140 can re-program the duty cycle adjuster 140 such that export compliance is achieved (e.g., aggregate resolution threshold for a frame not exceeded). For example, if the ratio of high resolution to low resolution cycles as commanded by the external controller 120 violates the duty cycle threshold, the duty cycle calculator 150 can re-program the duty cycle adjuster 140 to the next lower duty cycle (or default low duty cycle) that provides the highest possible resolution while still achieving aggregate resolution compliance over the course of the frame.

A frame profile 160 is typically submitted by a user (e.g., wireless service provider) to the external controller 120. The frame profile 160 can specify the number of uplink, downlink, and setup sub-frames that may be needed during the course of the frame. The frame profile 160 can change periodically but typically remains substantially stable over the course of time. The external controller 120 receives the information in the frame profile 160 and can generate the programming COMMANDS (e.g., register commands described below) that are sent to the digital converter 110 which are then employed to update the duty cycle adjuster 140. The resolution controller 130 can include trigger logic (not shown) responsive to the TRIGGER command from the external controller 120 to switch from a lower output resolution to higher output resolution for the plurality of different output resolutions. In one specific example, the trigger logic enables operation of a register bank, where the trigger logic is activated after at least one low resolution counter times out to specify a low resolution output period for the digital converter 110. The trigger logic then enables at least one high resolution counter to begin counting to specify a high resolution output period for the digital converter 110.

As used herein, output resolution for an ADC refers to the number of data bits per sample that are generated. Output resolution for a DAC refers to the number of data bits per sample that were employed to generate the analog output signal. For an ADC, high resolution output refers to the maximum capability for the ADC (e.g., 14 bits). For low resolution output, either the low or the high bits can be zeroed, for example, to limit the output resolution from the maximum. For example, if the two lowest bits or two highest bits were zeroed, a 14 bit output would thus become a 12 bit output. As will be described below, an additional input shown as SNR BOOST can be employed to control operations of the digital converter 110. The SNR BOOST input controls the operating frequency range of the digital converter to improve noise performance of the converter. As such, if SNR BOOST is commanded by the external controller 120, the duty cycle adjuster 140 can be adapted to accommodate the new operating range of the digital converter 110 caused by the selection of SNR BOOST. For example, if SNR BOOST were selected, the high output for the ADC at 500 MSPS may be set to 11 bit resolution from 12 bit resolution (e.g., operating before SNR BOOST selected) to operate in accordance with the adjustment made by SNR BOOST.

Figure 2:
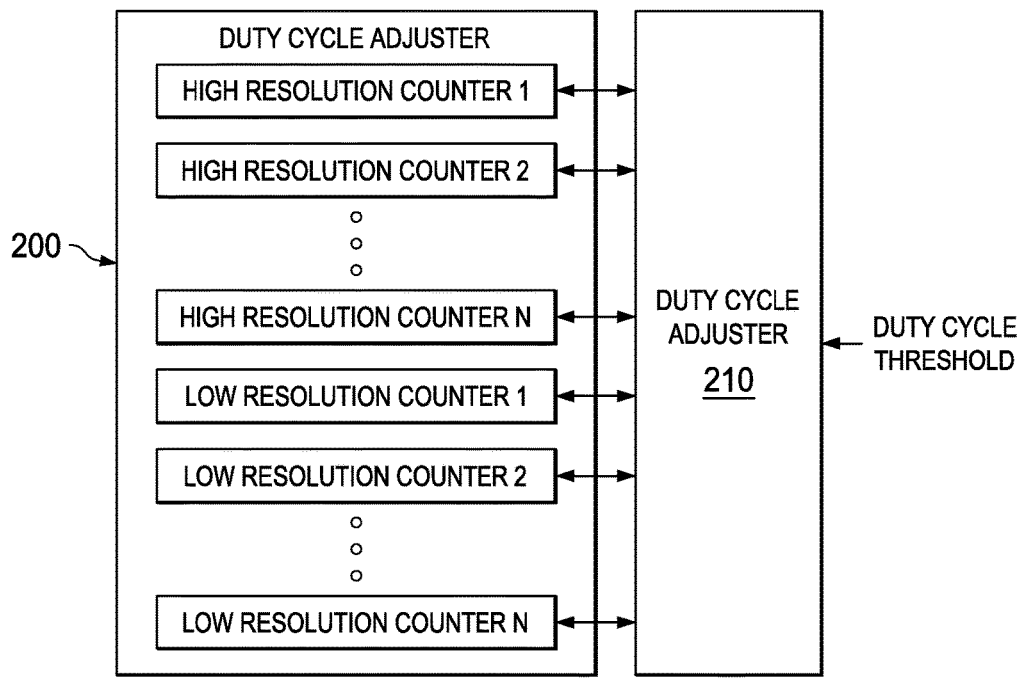
FIG. 2 illustrates an example duty cycle adjuster and calculator to dynamically adjust output resolution of a digital converter over the course of a given frame.
Figure 3:
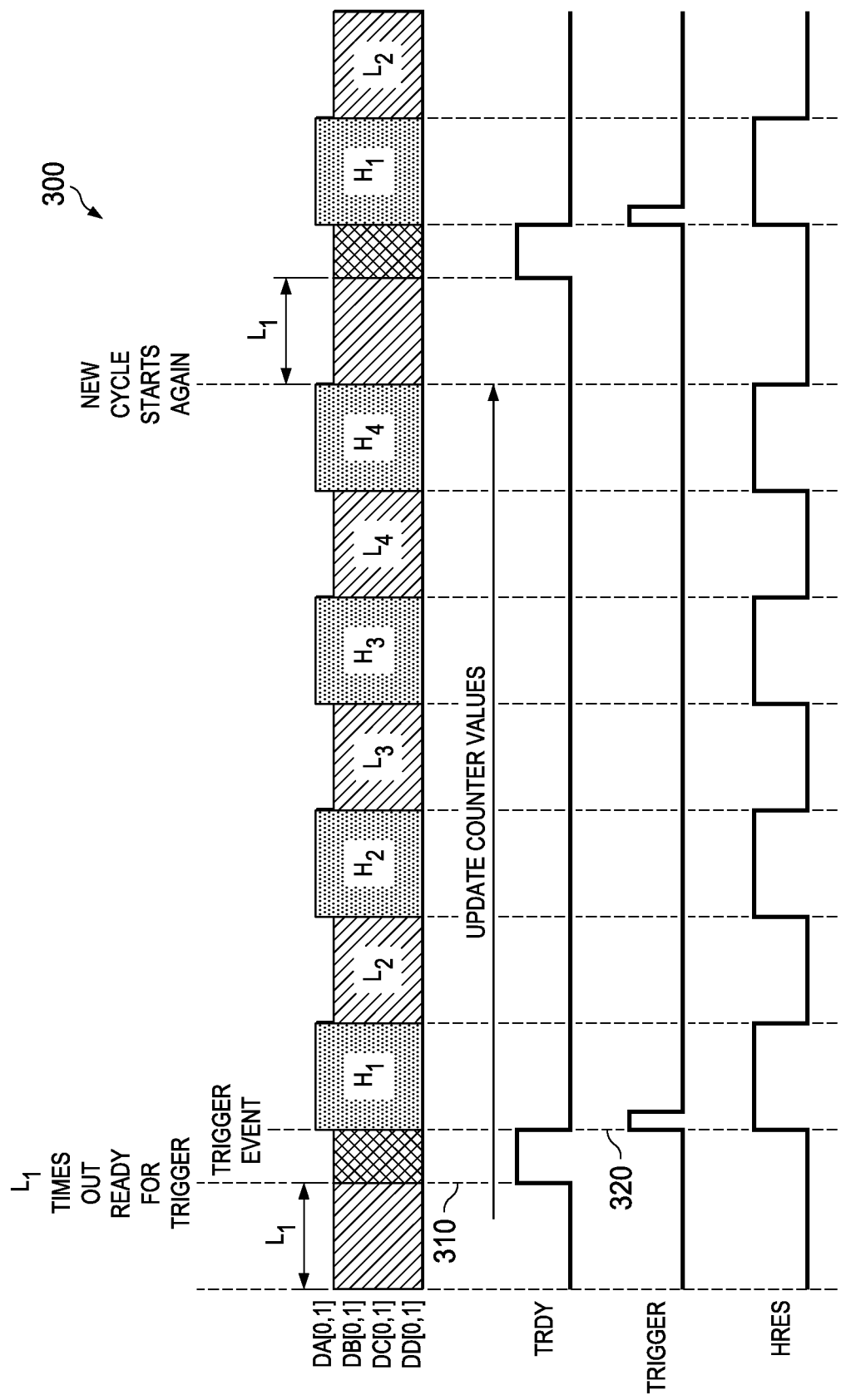
FIG. 3 illustrates an alternating high and low resolution pattern that can be generated over the course of one frame by a digital converter as specified by the counters described with respect to FIG. 2.

FIG. 2 illustrates an example duty cycle adjuster 200 and duty cycle calculator 210 to dynamically adjust output resolution of a digital converter over the course of a given frame. In this example, the duty cycle adjuster 200 includes a number of complimentary counters shown as HI RES counters 1-N and LO RES counters 1-N. In many applications only a single pair—one HI RES and one LO RES counter, is needed to specify the low resolution output period and the high resolution output period for the digital converter. In other applications, a plurality of complimentary counters may be needed. For example, in a TDD frame for an ADC, having four uplink sub-frames and four downlink sub-frames, four high resolution counters could be programmed to correlate with the four uplink sub-frames (active period of ADC), and four low resolution counters could be programmed to correlate with the four downlink sub-frames (inactive period for ADC). Thus, when the digital converter is operating, each counter counts to indicate how long (e.g., number of clock cycles specified by the counter) the converter should generate its respective high resolution value or low resolution value. FIG. 3 described below illustrates an alternating high and low resolution pattern that can be generated over the course of one frame that can be specified by the HI RES and LO RES counters of the duty cycle adjuster 200.

The duty cycle calculator 210 monitors the HI RES and LO RES counters of the duty cycle adjuster 200 to determine if the counter settings comply with a predetermined duty cycle threshold. When the counters are updated, the duty cycle calculator 210 determines if the threshold has been exceeded. Upon the programming of the counters, the duty cycle calculator 210 calculates the corresponding duty cycle for the selected high resolution output. If the duty cycle violates the limits, the digital outputs are limited to low resolution output (or next lower resolution output that does not exceed limit). The limiting can occur by the duty cycle calculator updating the counters to a value that does not exceed the duty cycle threshold. The duty cycle can be computed using the following Equation 1, where H1 is HI RES counter 1, L1 is LO RES counter 1, and so forth. If only a single counter pair is employed, Equation 1 simplifies to H1/L1.

$$\text{DUTY CYCLE} = \frac{H1(+H2+H3+H4)}{L1(+L2+L3+L4)} \quad \text{Equation 1}$$

FIG. 3 illustrates an alternating high and low resolution pattern diagram 300 that can be generated over the course of one frame by a digital converter as specified by the counters described with respect to FIG. 2. High and low resolution output from the digital converter is shown as L1 followed by H1 on the diagram 300, followed by L2, followed by H2, and so forth over the course of the frame which ends at the end of H4 in this example. The HI and LO RES counters described above set the respective time periods for each high or low resolution output where the timing out of one counter initiates the start of the next counter and hence the beginning of the next resolution output for the digital converter.

Before the alternating pattern of high and low resolution outputs can begin however, a manual trigger is received at the end of the low resolution period L1 as shown at reference numeral 310. In this manner, an external controller can synchronize the output from the digital converter with the respective frame. Additionally, the manual trigger allows the digital converter to align its high resolution outputs with uplink sub-frames (for ADC applications) and to align its low resolution outputs downlink frames (for ADC applications). It is noted that the manual trigger could be set for the beginning or the end of any of the resolution periods described herein. As shown at reference numeral 320, the high resolution outputs from the digital converter begin after the trigger input is received.

Figure 4:
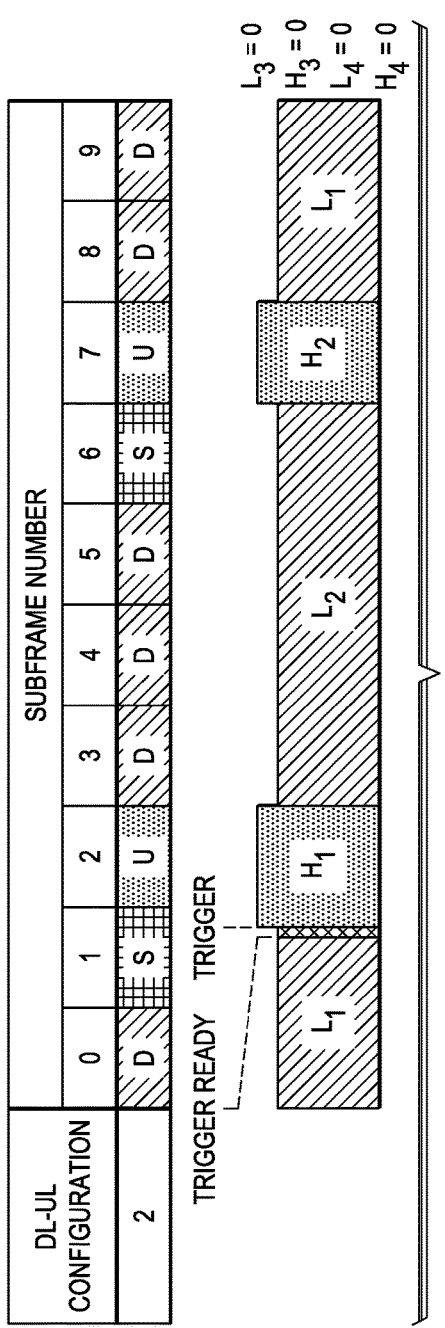
FIGS. 4 and 5 illustrate specific duty cycle configuration examples for a time division duplex (TDD) application.
Figure 5:
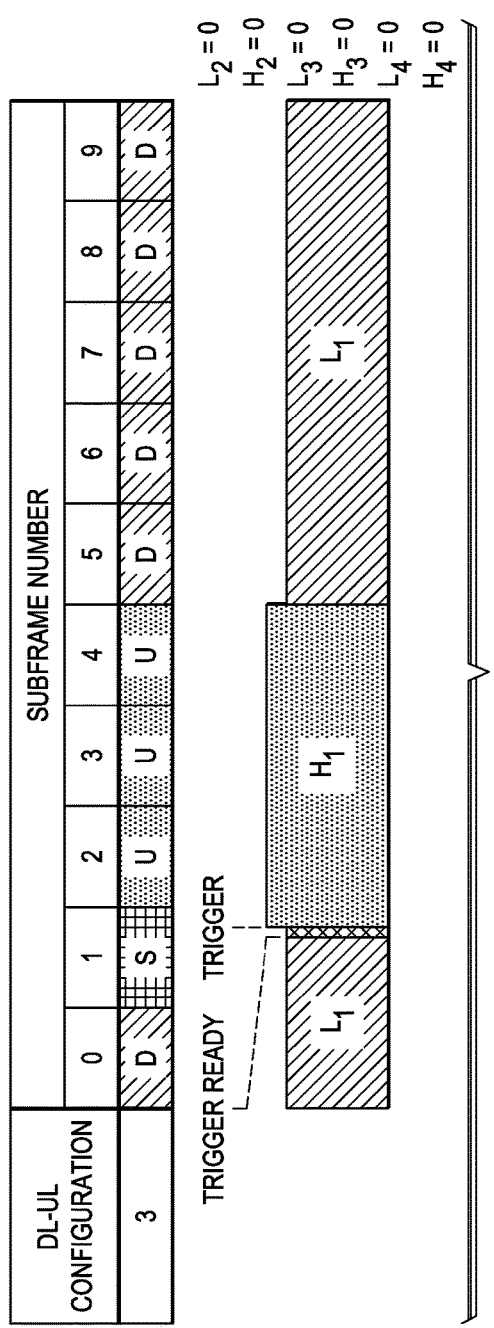

FIGS. 4 and 5 illustrate specific duty cycle configuration examples for a time division duplex (TDD) application. As noted previously, individual counters for high and low resolution output data can be programmed such that the high resolution samples line up with receive (uplink) sub-frames (for ADC) and the low resolution samples line up with transmit (downlink) sub-frames (for ADC), where setup frames denoted as S, are where no data is present in the receive path. The following Table 1 illustrates some possible duty cycle configuration examples listed as examples 1-9 and are operative when the digital converter is operating at about 500 MSPS.

TABLE 1

| Example | # of Setup Frames | # of Downlink Frames | # of Uplink Frames | Duty Cycle | High Resolution output (500 Msps) |
|---|---|---|---|---|---|
| 1 | 1 | 8 | 1 | 1:9 (0.11) | 14 bit |
| 2 |   | 7 | 2 | 2:8 (0.25) | 14 bit |
| 3 |   | 6 | 3 | 3:7 (0.43) | 12 bit |
| 4 |   | 5 | 4 | 4:6 (0.67) | 11/12 bit |
| 5 |   | 1-4 | 5-8 | (1+) | 11 bit |
| 6 | 2 | 6 | 2 | 2:8 (0.25) | 14 bit |
| 7 |   | 5 | 3 | 3:7 (0.43) | 12 bit |
| 8 |   | 4 | 4 | 4:6 (0.67) | 11/12 bit |
| 9 |   | 1-3 | 5-7 | >1 | 11 bit |

As shown in FIG. 4, a TDD frame has 10 equal size sub-frames listed as sub-frames 0-9 from left to right. For the DL-UL (downlink-uplink) configuration #2 from Table 1 for example, the high and low resolution counters can be set for a given ADC sampling rate to match the downlink-uplink profile as shown below in FIG. 4. In this example, the profile reads as D, S, U, D, D, D, S, U, D, and D which is the order listed in the sub-frames, where S refers to a setup sub-frame. As described above, a trigger can be used to initiate the high resolution output data. In this manner, synchronization with the frame can be maintained as well. The counter L1 covers the low resolution data across two consecutive TDD frames and most of setup frame. For configuration #2, a duty cycle of ~2/8 can be achieved with a sampling rate of 500 Msps and the high resolution output selected for 14 bit.

FIG. 5 shows an alternative configuration example from the example depicted in FIG. 4. In this example, configuration #3 from Table 1 above provides a duty cycle of ~3/7 and can be achieved by programming two counters—one high and one low. With a sampling rate of 500 MSPS, a high resolution output of 12 bit can be used. In this example, the frame profile reads as D, S, U, U, U, D, D, D, D, and D.

Figures 6, 7:
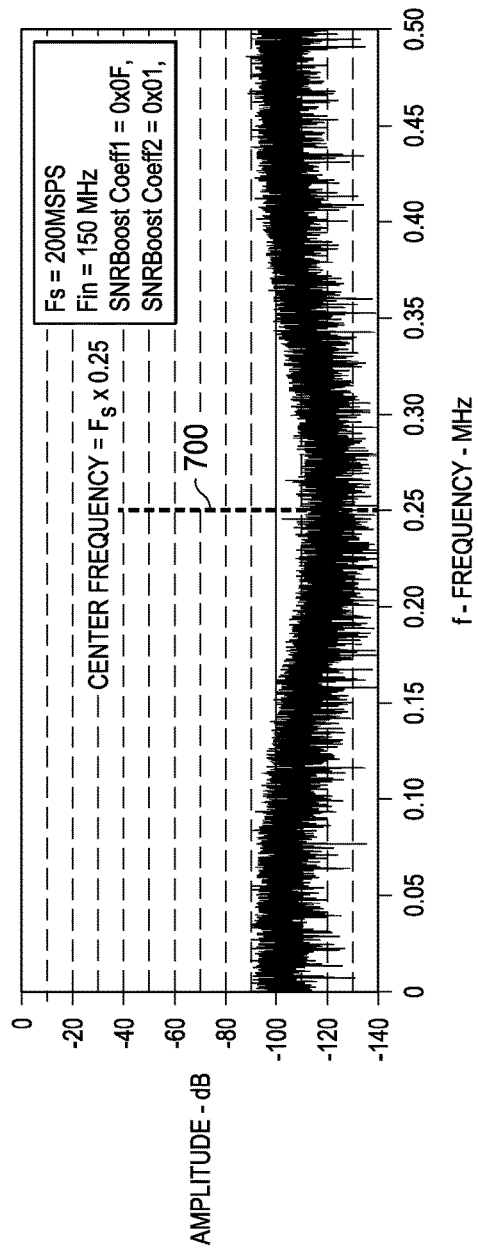
FIG. 6 illustrates four alternative frame profile examples for dynamic resolution adjustment.
FIG. 7 illustrates a signal diagram that describes an SNR BOOST operating mode of a digital converter.

FIG. 6 illustrates four alternative frame profile examples for dynamic resolution adjustment. The frame profile examples are listed as examples 1 though 4. Example 1 profile reading left to right from the profile number is D, S, U, U, D, D, D, S, U, U, and D. Example 2 profile is D, S, U, U, U, D, D, D, D, and D. Example 3 profile is D, S, U, D, U, D, U, D, U, and D. Example 4 profile is D, S, U, U, D, D, D, U, U, and D.

For example 1 at a sampling rate of 491.52 MSPS, the register programming can be computed as follows where T refers to the time allotted to the subframe, UpPTS refers to the setup time S for the setup slot that precedes the uplink sub-frame, DwPTS refers to the setup time S for the setup slot that precedes the downlink sub-frame, and GUARD represents a fixed housekeeping time:

High resolution time: UpPTS (0.2 ms)+$T2$ (1 ms)+ $T3$ (1 ms)=2.2 ms

Low resolution time: $T0$ (1 ms)+Guard+DwPTS (0.8 ms)+$T4$=2.8 ms $H1$=491.52 Msps*2.2 ms/4=270,336

$L1$=491.52 Msps*2.8 ms/4=344,064

Duty Cycle: 270,336/344,064=0.786=>11 bit with SNR boost.

For example 2 at a sampling rate of 491.52 MSPS:

High resolution time: UpPTS (0.2 ms)+$T2$+$T3$+$T4$ (1 ms)=3.2 ms

Low resolution time: Guard+DwPTS (0.8 ms) $T0$+$T5$+$T6$+$T7$+$T8$+$T9$ (1 ms)=6.8 ms $H1$=491.52 Msps*3.2 ms/4=393,216

$L1$=491.52 Msps*6.8 ms/4=835,584

Duty Cycle: 393,216/835,584=0.471=>12 bit.

For example 3 at a sampling rate of 491.52 MSPS:

$L1$=Guard+DwPTS (0.8 ms)+$T1$+$T9$ (1 ms)=2.8 ms=344,064

$H1$=UpPTS (0.2 ms)+$T2$ (1 ms)=1.2 ms=147,456

$L2$=$T3$=1 ms=122,880

$H2$=$T4$=1 ms=122,880

$L3$=$T5$=1 ms=122,880

$H3$=$T6$=1 ms=122,880

$L4$=$T7$=1 ms=122,880

$H4$=$T8$=1 ms=122,880

$H$=491.52 Msps*4.2 ms/4=516,096

$L$=491.52 Msps*5.8 ms/4=712,704

Duty Cycle: 516,096/712,704=0.724=>11 bit with SNR boost.

For example 4 at a sampling rate of 491.52 MSPS:

$L1$=Guard+DwPTS (0.8 ms)+$T1$+$T9$ (1 ms)=2.8 ms=344,064

$H1$=UpPTS (0.2 ms)+$T2$+$T3$ (1 ms)=2.2 ms=270,336

$L2$=$T3$+$T4$+$T5$=3 ms=368,640

$H2$=$T7$+$T8$=2 ms=245,760

$H$=491.52 Msps*4.2 ms/4=516,096

$L$=491.52 Msps*5.8 ms/4=712,704

Duty Cycle: 516,096/712,704=0.724=>11 bit with SNR boost.

FIG. 7 illustrates a signal diagram that describes an SNR BOOST operating mode of a digital converter. As described above with respect to FIG. 1, SNR BOOST can be employed to enhance signal to noise operating characteristics of a converter. As such if SNR BOOST is selected, the high and low resolution counters described above can be re-configured to accommodate such selection. SNRBOOST technology makes it possible to overcome SNR limitations due to quantization noise within the digital converter. For example, with SNRBOOST, enhanced SNR can be obtained for substantially any bandwidth (less than Nyquist or Fs/2).

When SNR BOOST is enabled, the noise floor in the spectrum acquires a typical bath-tub shape as shown in FIG. 7. A bath-tub shape is centered around a specific frequency (called center frequency) at reference numeral 700. The center frequency is located about mid-way between two corner frequencies, which are specified by the SNR BOOST coefficients in the converter. By choosing appropriate coefficients, the bath-tub can be positioned over the frequency range 0 to Fs/2. By positioning the bath-tub within the desired signal band, SNR improvement can be achieved. If SNR BOOST is selected, the operating frequency of the converter can change which affects the programming of the high and low registers. For example, the examples #5 and #9 listed in Table 1 above shows programming configurations for the counters when SNR BOOST is selected. As shown, the high resolution output value can be lowered (e.g., to 11 bits) from some higher number (e.g., 12 bits) when SNR BOOST is selected.

Figure 8:
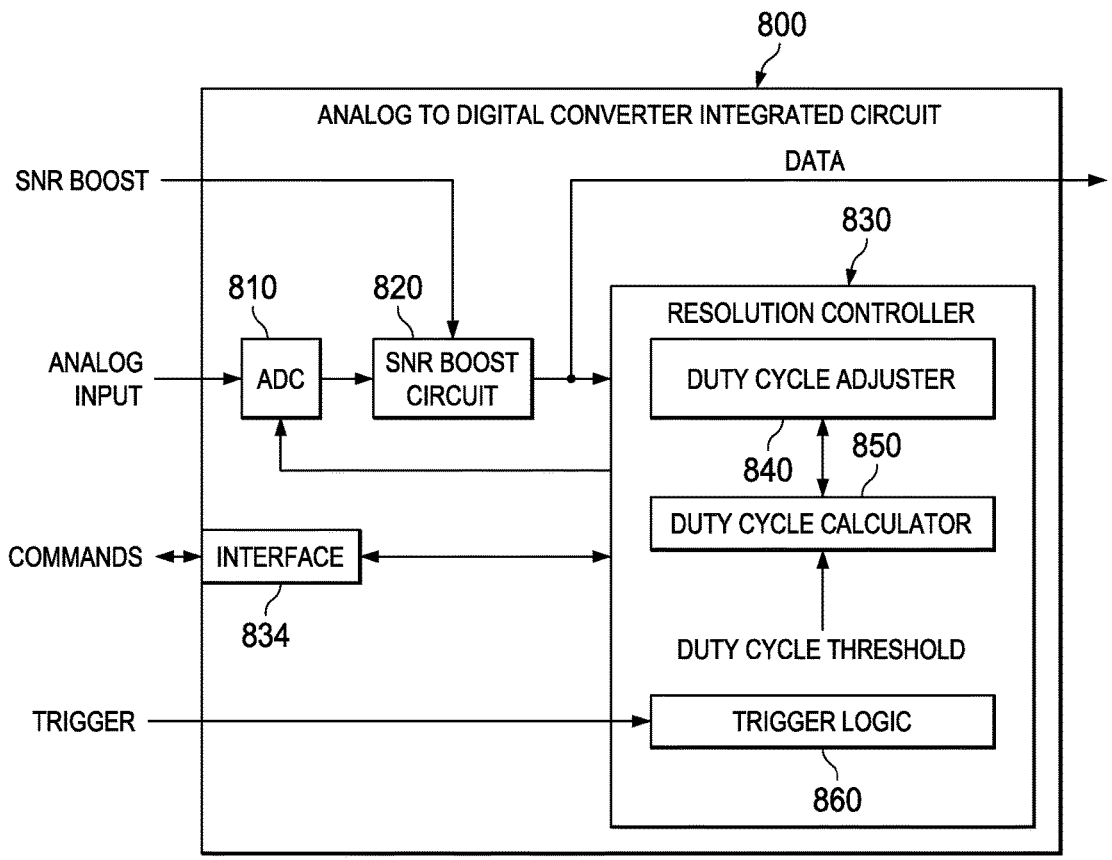
FIG. 8 illustrates an example analog converter integrated circuit that dynamically adjusts its output resolution over the course of a given frame.

FIG. 8 illustrates an example analog to digital converter (ADC) integrated circuit 800 that dynamically adjusts its output resolution over the course of a given frame. The circuit 800 includes an ADC 810 that converts an analog input to a desired resolution at a given sample rate. Output from the ADC 810 is fed through an SNR BOOST circuit 820 that can be enabled or disabled via an SNR control input command SNR BOOST. Output from the SNR BOOST circuit 820 is received by a resolution controller 830. The resolution controller 830 can include a duty cycle adjuster 840 that adjusts the operation of the high and low resolution output of the ADC 810 over the course of the frame.

In one example, the duty cycle adjuster 140 can be a register bank that is programmed via commands (shown as COMMANDS) and received via an interface 834. The interface 834 can be a parallel and/or serial interface and can be segmented to interact with each component in the integrated circuit 800 separately. A duty cycle calculator 850 is employed to verify the programming of the duty cycle adjuster 840. If the programming of the duty cycle adjuster 840 exceeds a predetermined duty cycle threshold (shown as DUTY CYCLE THRESHOLD), the duty cycle calculator 850 can re-program the duty cycle adjuster 840 such that export compliance is achieved (e.g., aggregate resolution threshold for a frame not exceeded). Trigger logic 860 can be employed with the resolution controller 830 to enable triggering of the high resolution outputs and to enable synchronization of the ADC output with the frame (e.g., synchronization with uplink and downlink sub-frames within a given TDD frame).

Figure 9:
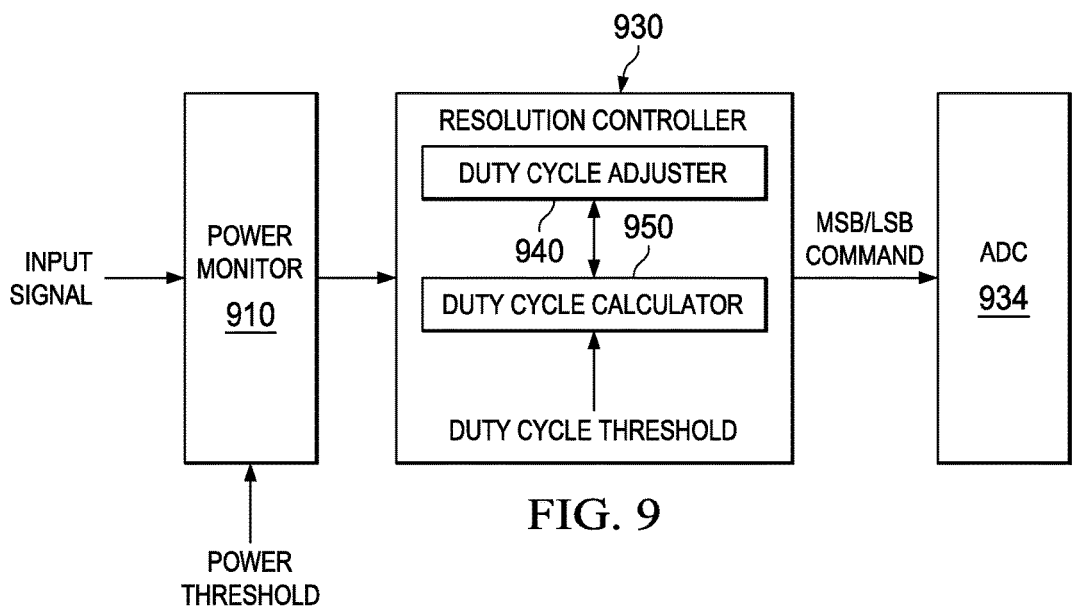
FIG. 9 illustrates an example power monitor and resolution controller for dynamically adjusting output resolution of a digital converter.

FIG. 9 illustrates an example power monitor 910 and resolution controller 930 for dynamically adjusting output resolution of a digital converter. In this example, an analog to digital converter (ADC) 934 is shown as the digital converter that operates with the resolution controller 930 however a digital to analog converter could also be employed as described herein. The resolution controller 930 can include a duty cycle adjuster 940 that adjusts the operation of the high and low resolution output of the ADC 910 as previously described. The power monitor 910 monitors the power of an input signal to be converted by the ADC 934. If the input signal is above a predetermined power threshold, the power monitor can send a command signal to the resolution controller 930 to send a command to the ADC 934 to adjust its low output resolution to be discarded. For example, if the low resolution output were set to 12 bits of a 14 bit full scale converter, the least two significant bits (or other number of LSBs) could be discarded for low resolution output under high signal conditions.

If the power level changes, where signal conditions are poor and below the power threshold, the power monitor 910 can signal the resolution controller 930 to command that the most significant bits (MSBs) be discarded from the output of the ADC 934. In this manner, the dynamic range of the converter can be increased. In yet another example, the power threshold can be determined automatically according to the duty cycle. For example, if the discarded bits are a three bit, then set the threshold 3×6 decibels full scale (dBFS). Thus, if the input signal is lower than 18 dBFS, discard the high 3 bits, otherwise discard low 3 bits.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
   a digital converter configured to convert an input signal to an output signal, wherein the digital converter is configured to provide the output signal with at least one of a plurality of different output resolutions during each frame based on a control input; and
   a resolution controller configured to set a resolution of the digital converter to include at least two of the plurality of different output resolutions during each frame such that an aggregate resolution of the digital converter is maintained below a threshold over time, the aggregate resolution being based on a ratio of the at least two of the plurality of different output resolutions during each frame.

2. The circuit of claim 1, wherein the resolution controller includes a duty cycle adjuster configured to set the resolution of the digital converter.

3. The circuit of claim 2, wherein the duty cycle adjuster comprises a register bank that includes at least one high resolution counter and at least one low resolution counter programmable to set the ratio of the at least two of the plurality of different output resolutions.

4. The circuit of claim 3, wherein the resolution controller further comprises a trigger logic configured to enable operation of the register bank, wherein the trigger logic is configured to activate the at least one high resolution counter to begin counting to specify a high resolution output period after a preceding low resolution counter provides an indication of a completion of a low resolution output period.

5. The circuit of claim 4 further comprising:
an interface circuit configured to receive a command input to program the register bank for a given frame by programming values for the at least one high resolution counter and the at least one low resolution counter for the given frame.

6. The circuit of claim 5, wherein the resolution controller further comprises a duty cycle calculator configured to derive a duty cycle corresponding to the aggregate resolution for the given frame, the duty cycle derived as a ratio computed based on a value of each programmed high resolution counter with respect to a value of each programmed low resolution counter for the given frame, the duty cycle calculator being configured to re-program the register bank to a different duty cycle for the given frame if the derived duty cycle exceeds a duty cycle threshold.

7. The circuit of claim 1, wherein the frame is a time division duplex (TDD) frame that includes at least one uplink sub-frame, at least one downlink sub-frame, and at least one setup sub-frame between a downlink sub-frame and a next adjacent uplink sub-frame in a given frame, the resolution controller configured to vary a resolution of the digital converter for each downlink sub-frame during each frame based on the control input.

8. The circuit of claim 1 further comprising:
a power monitor configured to notify the resolution controller of input power signal conditions based on a power threshold, wherein the resolution controller adjusts one or more least significant bits of the digital converter for low resolution output when the input power signal conditions are above the power threshold and adjusts one or more most significant bits of the digital converter for high resolution output when the input power signal conditions are below the power threshold.

9. The circuit of claim 1 further comprising:
a signal-noise ratio (SNR) boost circuit configured to boost signal to noise operating characteristics of the digital converter in response to an SNR boost input signal, wherein the resolution controller adapts the ratio of the at least two of the plurality of different output resolutions in response to the SNR boost input signal.

10. The circuit of claim 1, wherein the digital converter is an analog to digital converter (ADC).

11. A circuit comprising:
a digital converter configured to convert an input signal to an output signal, wherein the digital converter is configured to provide the output signal with at least one of a plurality of different output resolutions during each frame based on a control input; and
a resolution controller configured to set a resolution of the digital converter to include at least two of the plurality of different output resolutions during each frame such that an aggregate resolution of the digital converter is maintained below a threshold over time, the aggregate resolution being based on a duty cycle of the at least two of the plurality of different output resolutions during each frame, the resolution controller comprises a duty cycle calculator configured to compute the duty cycle associated with each frame and to compare the computed duty cycle with a duty cycle threshold, wherein the duty cycle calculator is configured to reprogram the duty cycle to a lower value if the computed duty cycle exceeds the duty cycle threshold for the frame.

12. The circuit of claim 11, wherein the resolution controller further includes a duty cycle adjuster configured to set the resolution of the digital converter.

13. The circuit of claim 12, wherein the duty cycle adjuster comprises a register bank that includes at least one high resolution counter and at least one low resolution counter to specify the duty cycle of the at least two of the plurality of different output resolutions during each frame.

14. The circuit of claim 13, wherein the resolution controller further comprises a trigger logic configured to enable operation of the register bank, wherein the trigger logic is configured to activate the at least one high resolution counter to begin counting to specify a high resolution output period after a preceding low resolution counter provides an indication of a completion of a low resolution output period.

15. The circuit of claim 11, wherein each frame is a time division duplex (TDD) frame that includes at least one uplink sub-frame, at least one downlink sub-frame, and at least one setup frame between a downlink sub-frame and a next adjacent uplink sub-frame in a given frame.

16. The circuit of claim 11 further comprising:
a signal-noise ratio (SNR) boost circuit configured to boost signal to noise operating characteristics of digital converter in response to an SNR boost input signal, wherein the resolution controller adapts the duty cycle of the at least two of the plurality of different output resolutions in response to the SNR boost input signal.

17. The circuit of claim 11, wherein the digital converter is an analog to digital converter (ADC) configured to convert the input signal to a digital output signal.

18. A circuit comprising:
an analog to digital converter (ADC) configured to convert an analog input signal to a digital output signal, wherein the ADC is configured to provide the digital output signal with at least one of a plurality of different output resolutions during each of a plurality of frames based on a control input;
a duty cycle adjuster configured to set a resolution of the ADC to include at least two of the plurality of different output resolutions in different sub-frames of each frame, the duty cycle adjuster further configured to constrain an aggregate resolution of the ADC with respect to a threshold over time, the aggregate resolution corresponding to a computed duty cycle that is determined during each frame based on the at least two of the plurality of different output resolutions, the duty cycle adjuster includes at least one high resolution counter and at least one low resolution counter programmable to set the ratio of the at least two of the plurality of different output resolutions during each frame; and
a duty cycle calculator configured to compute the duty cycle and compare the computed duty cycle with a duty cycle threshold, wherein the duty cycle calculator is configured to reprogram the duty cycle if the computed duty cycle exceeds the duty cycle threshold.

19. The circuit of claim 18, wherein the frame is a time division duplex (TDD) frame that includes at least one uplink sub-frame, at least one downlink sub-frame, and at least one setup frame between a downlink sub-frame and a next adjacent uplink sub-frame in a given frame.

20. The circuit of claim 18 further comprising:
a signal-noise ratio (SNR) boost circuit configured to boost signal to noise operating characteristics of digital converter in response to an SNR boost input signal, wherein the duty cycle adjuster adapts the ratio of the at least two of the plurality of different output resolutions in response to the SNR boost input signal.

* * * * *